US012601828B2

(12) United States Patent
Wu et al.

(10) Patent No.: US 12,601,828 B2
(45) Date of Patent: Apr. 14, 2026

(54) WEARABLE DEVICE AND CONTROL METHOD THEREOF

(71) Applicant: HTC Corporation, Taoyuan City (TW)

(72) Inventors: Chun-Yih Wu, Taoyuan City (TW);
Ta-Chun Pu, Taoyuan City (TW);
Yen-Liang Kuo, Taoyuan City (TW);
Wei-Chih Chang, Taoyuan City (TW)

(73) Assignee: HTC Corporation, Taoyuan City (TW)

( * ) Notice: Subject to any disclaimer, the term of this patent is extended or adjusted under 35 U.S.C. 154(b) by 429 days.

(21) Appl. No.: 18/489,211

(22) Filed: Oct. 18, 2023

(65) Prior Publication Data

US 2025/0060472 A1     Feb. 20, 2025

(30) Foreign Application Priority Data

Aug. 14, 2023     (TW) ................................. 112130470

(51) Int. Cl.
*G01S 13/58*          (2006.01)
*G02B 27/01*          (2006.01)
(Continued)

(52) U.S. Cl.
CPC .......... *G01S 13/583* (2013.01); *G02B 27/017* (2013.01); *H05K 1/181* (2013.01);
(Continued)

(58) Field of Classification Search
CPC ..... G01S 7/02; G01S 7/35; G01S 7/40; G01S 7/41; G01S 7/46; G01S 13/00; G01S 13/04; G01S 13/06; G01S 13/18; G01S 13/34; G01S 13/42; G01S 13/50; G01S 13/58; G01S 13/88; G01S 13/89; G01S 13/931; G01S 13/583; G01S 13/343; G01S 13/347; G01S 13/588; G01C 19/00; G01C 21/00; G01C 21/10; G01C 21/16; G01C 25/00; G01P 15/00–18; G01P 21/00; G02B 27/01–017; G02B 2027/014; G06F 3/01;
(Continued)

(56) References Cited

U.S. PATENT DOCUMENTS

| | | | |
|---|---|---|---|
| 2002/0186532 A1* | 12/2002 | Tomioka ............ | H05K 7/20154 361/679.48 |
| 2008/0106428 A1* | 5/2008 | Yan ........................ | G06F 11/30 340/679 |

(Continued)

FOREIGN PATENT DOCUMENTS

| | | | | |
|---|---|---|---|---|
| CN | 115773209 A | * | 3/2023 | |
| WO | WO-2018152914 A1 | * | 8/2018 | ............... H04R 9/02 |

*Primary Examiner* — Vladimir Magloire
*Assistant Examiner* — Remash R Guyah
(74) *Attorney, Agent, or Firm* — Birch, Stewart, Kolasch & Birch, LLP

(57)          ABSTRACT

A wearable device includes a PCB (Printed Circuit Board), a fan element, a radar module, an IMU (Inertial Measurement Unit), and a processor. The fan element is disposed on the PCB. The radar module is adjacent to the fan element. The radar module detects the rotation state of the fan element, so as to generate a detection signal. The IMU is disposed on the PCB. The IMU measures the movement state of the PCB, so as to generate measurement data. The processor calibrates the measurement data according to the detection signal, so as to output a calibration measurement result.

19 Claims, 5 Drawing Sheets

(51) Int. Cl.
    *H05K 1/181*     (2026.01)
    *H05K 5/00*     (2025.01)
    *H05K 7/20*     (2006.01)

(52) U.S. Cl.
    CPC ....... *H05K 5/0078* (2013.01); *H05K 7/20972*
      (2013.01); *H05K 2201/10128* (2013.01); *H05K*
          *2201/10151* (2013.01)

(58) Field of Classification Search
    CPC .... H05K 1/18; H05K 1/0078; H05K 7/20972;
          H05K 1/181; H05K 5/0078; H05K
          2201/10128; H05K 2201/10151; H05K
          7/20136; G01D 5/20; G01D 21/02
    USPC ......................................................... 342/195
    See application file for complete search history.

(56) References Cited

U.S. PATENT DOCUMENTS

| | | | |
|---|---|---|---|
| 2015/0346820 A1 * | 12/2015 | Poupyrev | G01S 7/411 |
| | | | 345/156 |
| 2019/0302252 A1 * | 10/2019 | Santra | G01F 1/663 |
| 2021/0025976 A1 * | 1/2021 | Chandel | G01S 13/88 |
| 2021/0173275 A1 * | 6/2021 | Osterhout | G02B 27/017 |
| 2022/0312631 A1 * | 9/2022 | Xi | H05K 7/20172 |
| 2023/0247811 A1 * | 8/2023 | Moghaddam | G06F 1/1637 |
| | | | 361/688 |

\* cited by examiner

100

200

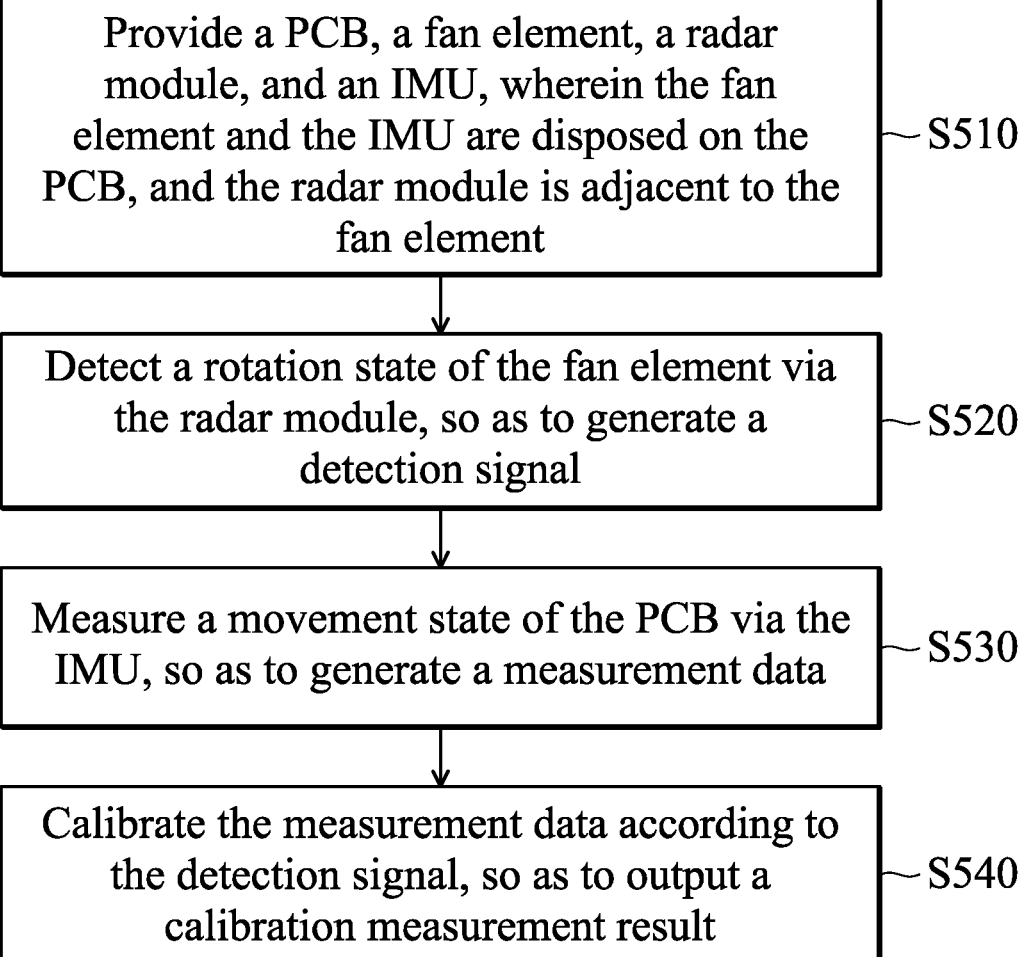

Provide a PCB, a fan element, a radar module, and an IMU, wherein the fan element and the IMU are disposed on the PCB, and the radar module is adjacent to the fan element ~S510

Detect a rotation state of the fan element via the radar module, so as to generate a detection signal ~S520

Measure a movement state of the PCB via the IMU, so as to generate a measurement data ~S530

Calibrate the measurement data according to the detection signal, so as to output a calibration measurement result ~S540

FIG. 5

WEARABLE DEVICE AND CONTROL METHOD THEREOF

CROSS REFERENCE TO RELATED APPLICATIONS

This application claims priority of Taiwan Patent Application No. 112130470 filed on Aug. 14, 2023, the entirety of which is incorporated by reference herein.

BACKGROUND OF THE INVENTION

Field of the Invention

The invention relates to a wearable device, and more particularly, to a wearable device with a calibration function.

Description of the Related Art

In order to solve the problem of heat dissipation, fan elements should be added to VR (Virtual Reality) devices or AR (Augmented Reality) devices. However, general fan elements often produce unpredictable vibration noises as they become older, and this may cause the detection error rate to rise. Accordingly, there is a need to propose a novel solution for overcoming the drawbacks of the prior art.

BRIEF SUMMARY OF THE INVENTION

In an exemplary embodiment, the invention is directed to a wearable device that includes a PCB (Printed Circuit Board), a fan element, a radar module, an IMU (Inertial Measurement Unit), and a processor. The fan element is disposed on the PCB. The radar module is adjacent to the fan element. The radar module detects the rotation state of the fan element, so as to generate a detection signal. The IMU is disposed on the PCB. The IMU measures the movement state of the PCB, so as to generate measurement data. The processor calibrates the measurement data according to the detection signal, so as to output a calibration measurement result.

In some embodiments, the fan element includes a blade portion, and a metal-coated region is formed on the blade portion.

In some embodiments, the wearable device is implemented with an HMD (Head Mounted Display).

In some embodiments, the radar module covers an mmWave (Millimeter Wave) frequency band, and the mmWave frequency band is from 59 GHz to 67 GHz.

In some embodiments, the radar module selectively operates in a CW (Continuous Wave) mode or an FMCW (Frequency Modulated Continuous Wave) mode.

In some embodiments, the radar module includes a transmitter, a receiver, and a controller. The transmitter transmits a radar signal to the fan element. The receiver receives a reflection signal from the fan element. The controller generates the detection signal according to the reflection signal.

In some embodiments, the detection signal includes time sequential data, and the time sequential data is related to the rotation speed of the fan element.

In some embodiments, the processor analyzes the time sequential data, so as to generate magnitude information and phase information. Then, the processor calibrates the measurement data according to the magnitude information and the phase information.

In some embodiments, the magnitude information corresponds to the separation distance between the fan element and the radar module, and the phase information corresponds to the rotation angle of the fan element.

In some embodiments, the IMU is a nine-axis sensor and includes a triaxial accelerometer, a triaxial gyroscope, and a triaxial magnetometer. The triaxial accelerometer measures the acceleration of the PCB. The triaxial gyroscope measures the angular velocity of the PCB. The triaxial magnetometer measures the magnetic field of the PCB. The measurement data includes the acceleration, the angular velocity, and the magnetic field.

In another exemplary embodiment, the invention is directed to a control method includes the steps of: providing a PCB, a fan element, a radar module, and an IMU, wherein the fan element and the IMU are disposed on the PCB, and the radar module is adjacent to the fan element; detecting the rotation state of the fan element via the radar module, so as to generate a detection signal; measuring the movement state of the PCB via the IMU, so as to generate measurement data; and calibrating the measurement data according to the detection signal, so as to output a calibration measurement result.

In some embodiments, the control method further includes: forming a metal-coated region on a blade portion of the fan element.

In some embodiments, the control method further includes: transmitting a radar signal to the fan element via the radar module; receiving a reflection signal from the fan element via the radar module; and generating a detection signal according to the reflection signal via the radar module.

In some embodiments, the control method further includes: analyzing the time sequential data, so as to generate magnitude information and phase information.

In some embodiments, the control method further includes: calibrating the measurement data according to the magnitude information and the phase information.

In some embodiments, the control method further includes: measuring the acceleration of the PCB via the IMU; measuring the angular velocity of the PCB via the IMU; and measuring the magnetic field of the PCB via the IMU. The measurement data includes the acceleration, the angular velocity, and the magnetic field.

BRIEF DESCRIPTION OF DRAWINGS

The invention can be more fully understood by reading the subsequent detailed description and examples with references made to the accompanying drawings, wherein:

FIG. 5 is a flowchart of a control method according to an embodiment of the invention.

DETAILED DESCRIPTION OF THE INVENTION

Figure 1:
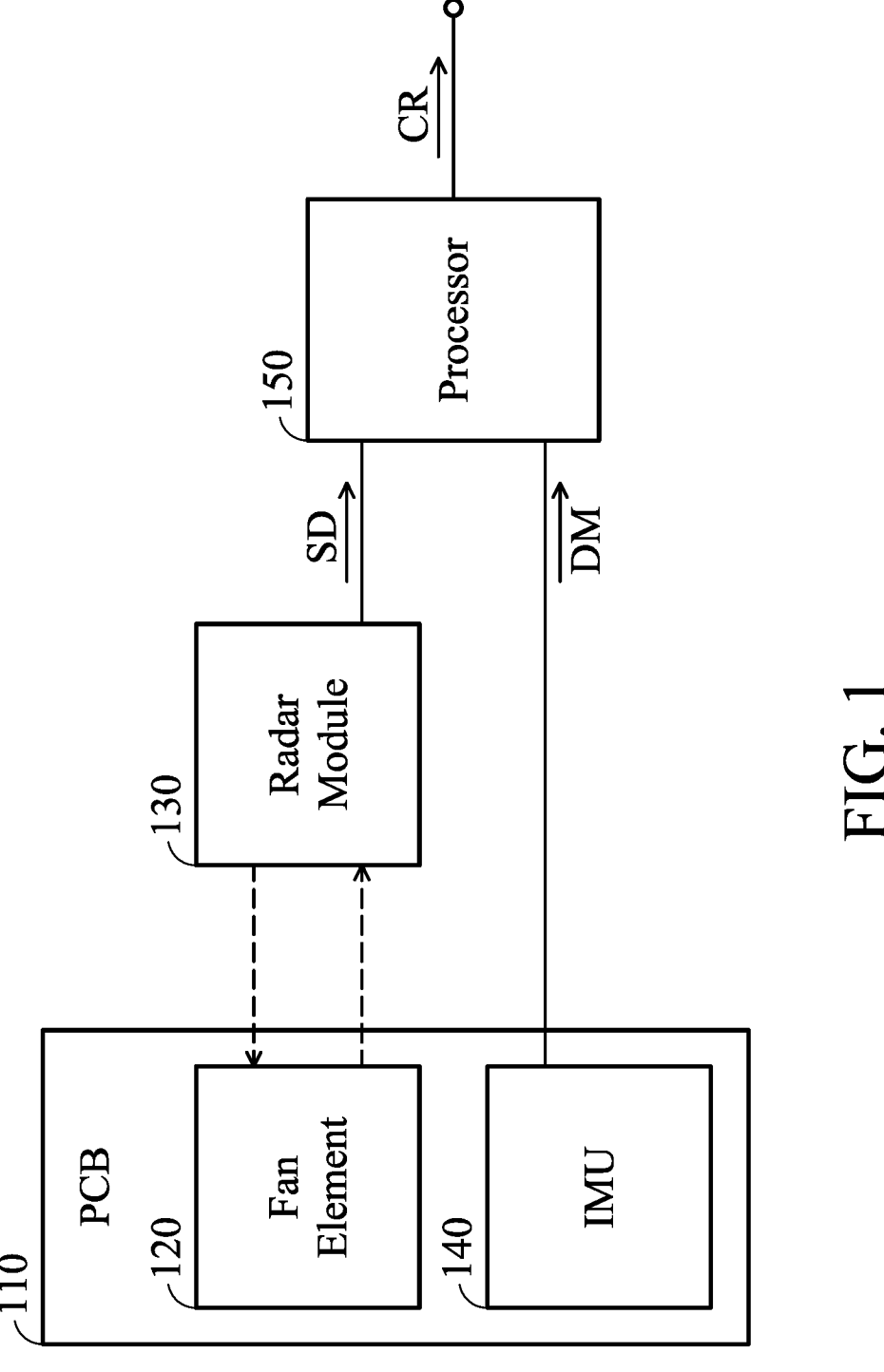
FIG. 1 is a diagram of a wearable device according to an embodiment of the invention.

In order to illustrate the foregoing and other purposes, features and advantages of the invention, the embodiments and figures of the invention will be described in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram of a wearable device 100 according to an embodiment of the invention. For example, the wearable device 100 may be implemented with an HMD (Head Mounted Display) or an AR (Augmented Reality) glass, but it is not limited thereto. In the embodiment of FIG. 1, the wearable device 100 includes a PCB (Printed Circuit Board) 110, a fan element 120, a radar module 130, an IMU (Inertial Measurement Unit) 140, and a processor 150. It should be understood that the wearable device 100 may further include other components, such as a housing, a speaker, a display device, and/or a power supply module, although they are not displayed in FIG. 1.

The fan element 120 is disposed on the PCB 110. The radar module 130 is adjacent to the fan element 120. The radar module 130 can detect the rotation state of the fan element 120, so as to generate a detection signal SD. The IMU 140 is disposed on the PCB 110. The IMU 140 can measure the movement state of the PCB 110, so as to generate a measurement data DM. The processor 150 is respectively coupled to the radar module 130 and the IMU 140. The processor 150 can calibrate the measurement data DM according to the detection signal SD, so as to output a calibration measurement result CR. The positions of the radar module 130 and the processor 150 are not limited in the invention. In some embodiments, the radar module 130 and the processor 150 are disposed on the PCB 110, or are disposed outside the PCB 110. It should be noted that the term "adjacent" or "close" over the disclosure means that the distance (spacing) between two corresponding elements is smaller than a predetermined distance (e.g., 10 mm or shorter), or means that the two corresponding elements directly touch each other (i.e., the aforementioned distance (spacing) between them is reduced to 0).

Generally, the fan element 120 can get rid of excess heat of the wearable device 100, and it is particularly necessary when the wearable device 100 performs a high-speed computing operation. However, the fan element 120 is usually a mechanical element. As the fan element 120 gradually becomes older, it may generate a non-ideal vibration, and the non-ideal vibration can be classified as a time-variant random function. Thus, it is difficult to filter out the non-ideal vibration by using general algorithms. Furthermore, since the fan element 120 and the IMU 140 are both disposed on the PCB 110, the non-ideal vibration of the fan element 120 may also interfere with the measurement data DM which is generated by the IMU 140.

To solve the aforementioned problem, the proposed wearable device 100 of the invention can use the radar module 130 to detect the rotation state of the fan element 120 and to generate the detection signal SD accordingly. Next, the processor 150 of the proposed wearable device 100 can calibrate the measurement data DM, which is generated by the IMU 140, according to the detection signal SD. Therefore, the interference factors from the fan element 120 can be eliminated. With the design of the invention, the processor 150 can provide the high-accurate calibration measurement result CR, which is almost not negatively affected by the non-ideal vibration of the fan element 120.

The following embodiments will introduce different configurations and detail structural features of the wearable device 100. It should be understood that these figures and descriptions are merely exemplary, rather than limitations of the invention.

Figure 2:
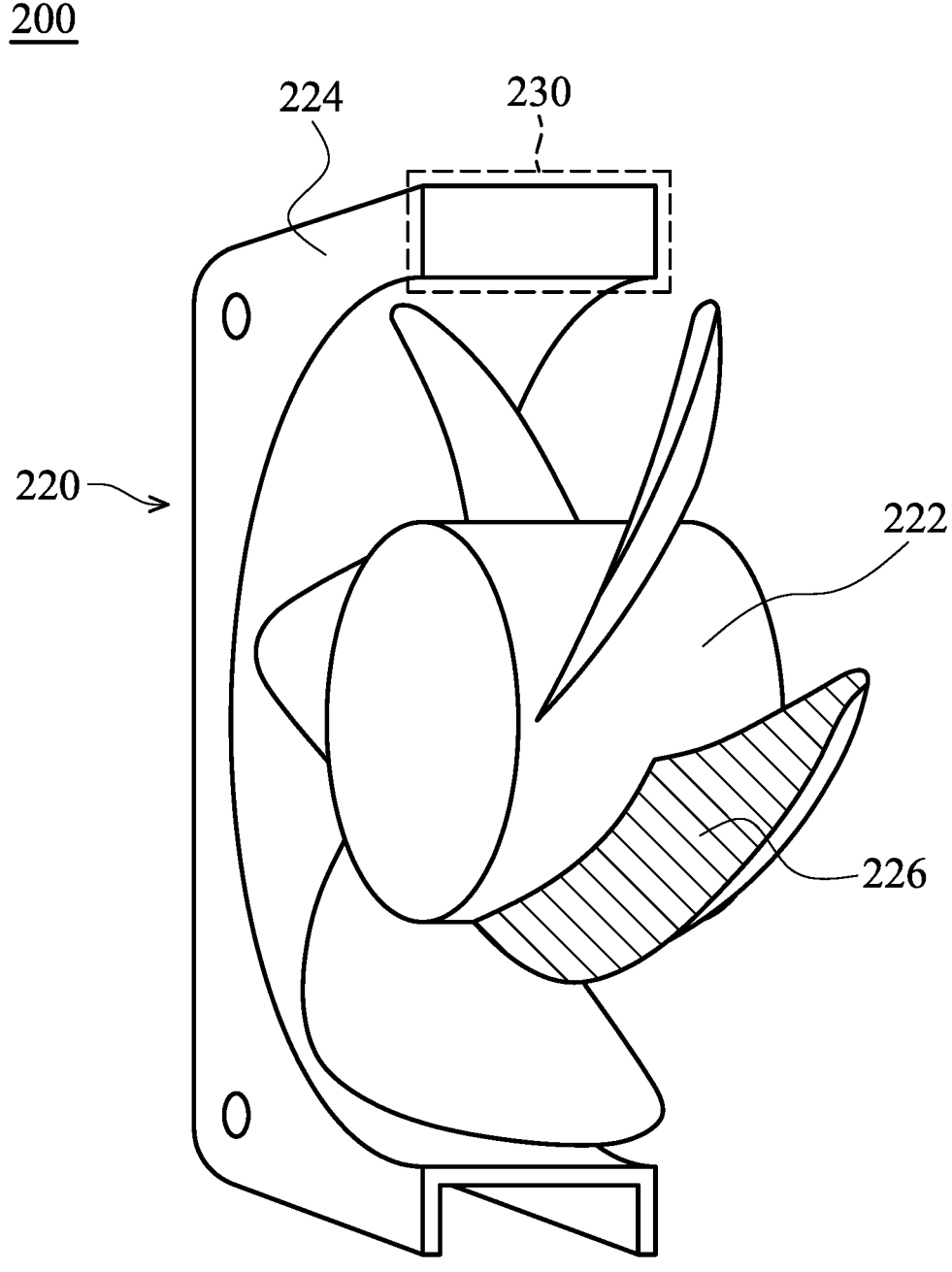
FIG. 2 is a diagram of partial elements of a wearable device according to an embodiment of the invention.

FIG. 2 is a diagram of partial elements of a wearable device 200 according to an embodiment of the invention. FIG. 2 is similar to FIG. 1. In the embodiment of FIG. 2, a fan element 220 of the wearable device 200 includes a blade portion 222 and a housing portion 224. The blade portion 222 is disposed inside the housing portion 224. For example, a radar module 230 of the wearable device 200 may be disposed on the housing portion 224 of the fan element 220, so as to save the overall design space, but it is not limited thereto. Also, in order to increase the radar detectable area, a metal-coated region 226 can be formed on the blade portion 222 of the fan element 220. With such a design, the radar module 230 can merely use relatively low transmission power to get good detection result. Other features of the wearable device 200 of FIG. 2 are similar to those of the wearable device 100 of FIG. 1. Accordingly, the two embodiments can achieve similar levels of performance.

Figure 3:
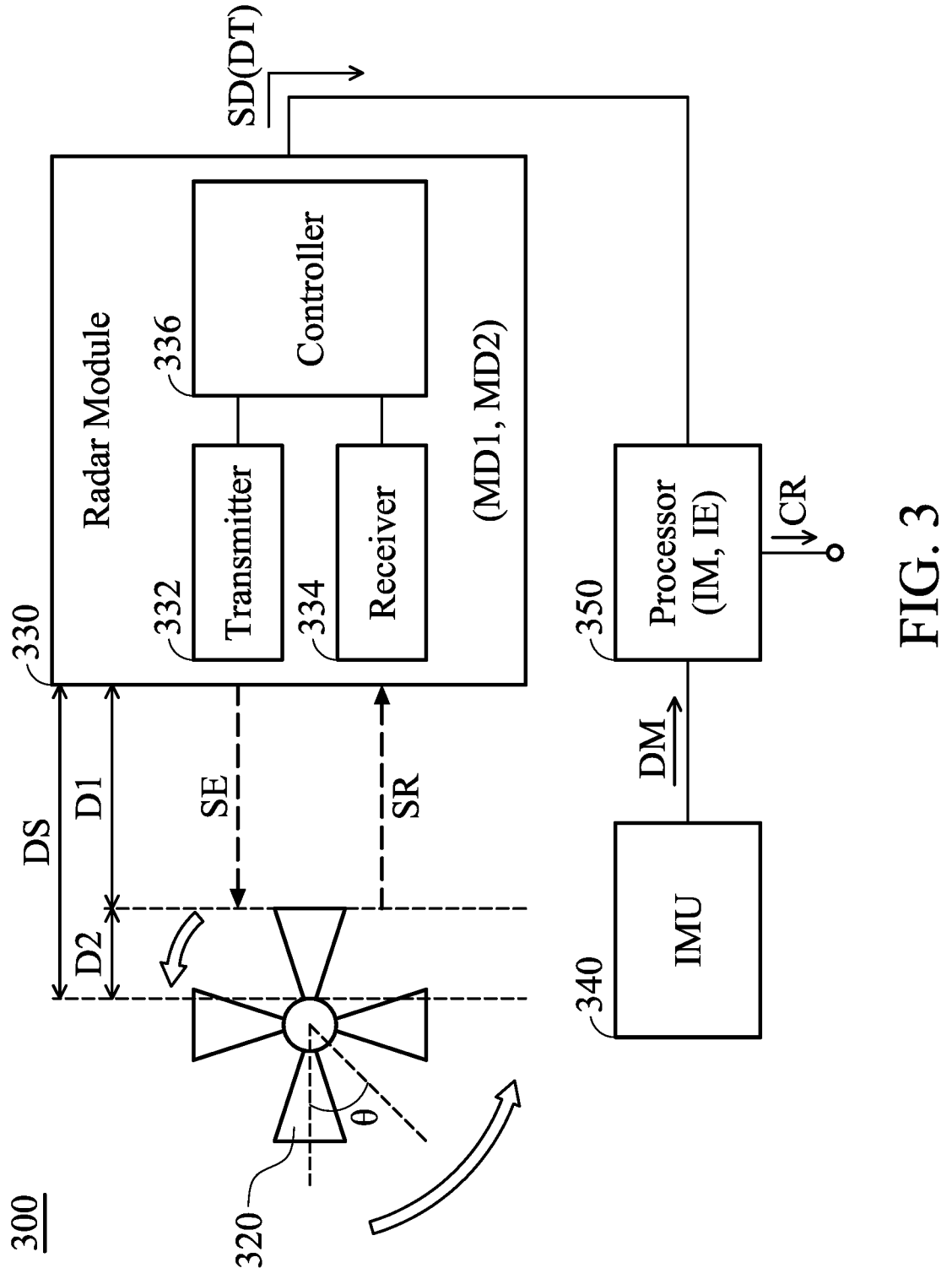
FIG. 3 is a diagram of partial elements of a wearable device according to an embodiment of the invention.

FIG. 3 is a diagram of partial elements of a wearable device 300 according to an embodiment of the invention. FIG. 3 is similar to FIG. 1. In the embodiment of FIG. 3, the wearable device 300 includes a PCB (not shown), a fan element 320, a radar module 330, an IMU 340, and a processor 350, whose functions and operations will be described as follows.

The radar module 330 can cover an mmWave (Millimeter Wave) frequency band. For example, the mmWave frequency band may be from 59 GHz to 67 GHz, but it is not limited thereto. Specifically, the radar module 330 includes a transmitter (TX) 332, a receiver (RX) 334, and a controller 336. The controller 336 is respectively coupled to the transmitter 332 and the receiver 334. In the beginning, the transmitter 332 can transmit a radar signal SE to the fan element 320. Next, the receiver 334 can receive a reflection signal SR from the fan element 320. Then, the controller 336 can generate a detection signal SD according to the reflection signal SR and/or the radar signal SE. It should be noted that the detection signal SD may include a time sequential data DT, and the time sequential data DT may be related to the rotation speed of the fan element 320. In some embodiments, the radar module 330 can selectively operate in a CW (Continuous Wave) mode MD1 or an FMCW (Frequency Modulated Continuous Wave) mode MD2. Based on different operational modes, the radar module 330 can transmit the corresponding radar signal SE to the fan element 320, but it is not limited thereto. In alternative embodiments, each of the transmitter 332 and the receiver 334 of the radar module 330 includes a plurality of antenna elements (not shown) for obtaining more specific detection results.

The processor 350 can analyze the time sequential data DT, so as to generate magnitude information IM and phase information IE. In some embodiments, the magnitude information IM corresponds to the separation distance DS between the fan element 320 and the radar module 330, and the phase information IE corresponds to the rotation angle θ of the fan element 320. For example, the separation distance DS may include a constant distance D1 and a variable distance D2. The variable distance D2 may be continuously adjusted based on the rotation state of the fan element 320. Finally, the processor 350 can calibrate the measurement data DM, which is generated by the IMU 340, according to the magnitude information IM and the phase information IE, so as to output a calibration measurement result CR. Other features of the wearable device 300 of FIG. 3 are similar to those of the wearable device 100 of FIG. 1. Accordingly, the two embodiments can achieve similar levels of performance.

Figure 4:
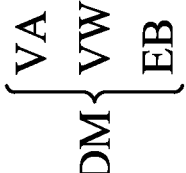
FIG. 4 is a diagram of partial elements of a wearable device according to an embodiment of the invention.
Figure 4:
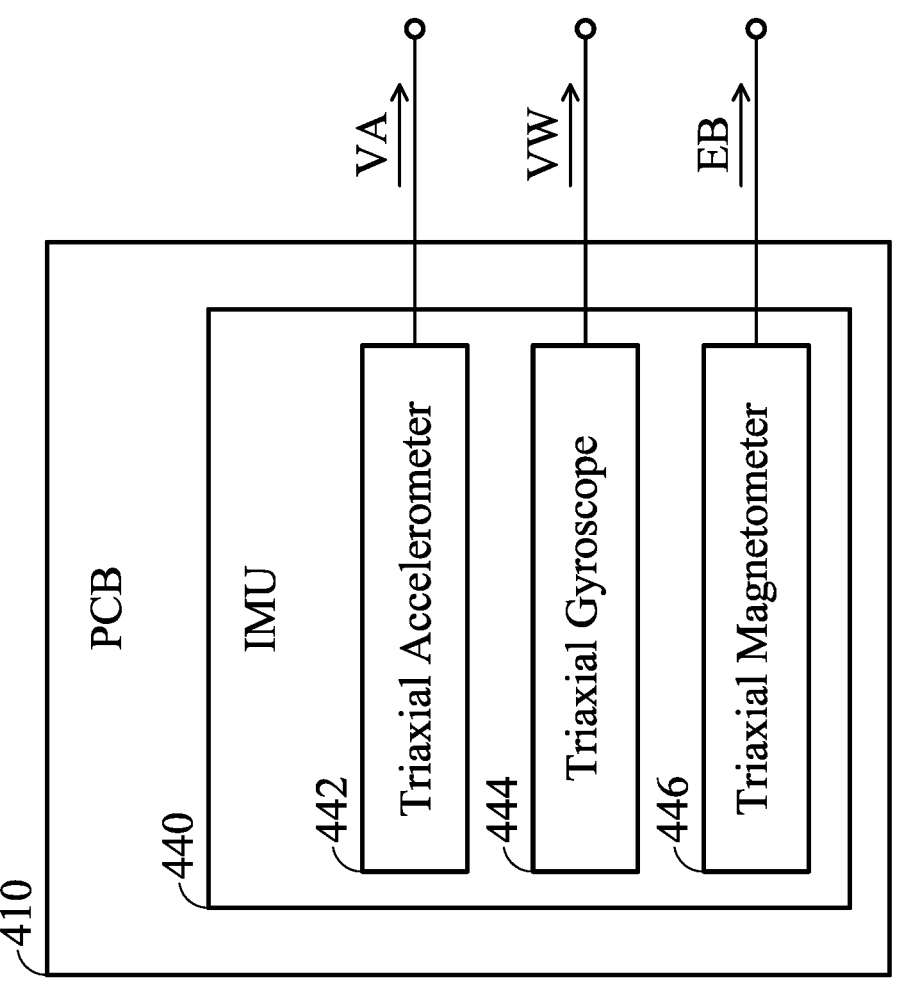

FIG. 4 is a diagram of partial elements of a wearable device 400 according to an embodiment of the invention. FIG. 4 is similar to FIG. 1. In the embodiment of FIG. 4, the wearable device 400 at least includes a PCB 410 and an IMU 440. The IMU 440 is disposed on the PCB 410. Specifically, the IMU 440 is a nine-axis sensor, and includes a triaxial accelerometer 442, a triaxial gyroscope 444, and a triaxial magnetometer 446. Particularly, the triaxial accelerometer 442 can measure the acceleration VA of the PCB 410. The triaxial gyroscope 444 can measure the angular velocity VW of the PCB 410. The triaxial magnetometer 446 can measure the magnetic field EB of the PCB 410. The measurement data DA, which is generated by the IMU 440, may include the acceleration VA, the angular velocity VW, and the magnetic field EB as mentioned above, but it is not limited thereto. Other features of the wearable device 400 of FIG. 4 are similar to those of the wearable device 100 of FIG. 1. Accordingly, the two embodiments can achieve similar levels of performance.

FIG. 5 is a flowchart of a control method according to an embodiment of the invention. To begin, in step S510, a PCB, a fan element, a radar module, and an IMU are provided. The fan element and the IMU are disposed on the PCB. The radar module is adjacent to the fan element. In step S520, the rotation state of the fan element is detected by the radar module, so as to generate a detection signal. In step S530, the movement state of the PCB is measured by the IMU, so as to generate a measurement data. Finally, the measurement data is calibrated according to the detection signal, so as to output a calibration measurement result. It should be understood that these steps are not required to be performed in order, and every feature of the embodiments of FIGS. 1 to 4 may be applied to the control method of FIG. 5.

The invention proposed a novel wearable device and a novel control method thereof. In comparison to the conventional design, the invention can effectively eliminate the vibration noise of the fan element and then obtain the calibrated measurement result. Therefore, the invention is suitable for application in a variety of devices.

Note that the above element parameters are not limitations of the invention. A designer can fine-tune these setting values according to different requirements. It should be understood that the wearable device and the control method of the invention are not limited to the configurations of FIGS. 1-5. The invention may include any one or more features of any one or more embodiments of FIGS. 1-5. In other words, not all of the features displayed in the figures should be implemented in the wearable device and the control method of the invention.

The method of the invention, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with a true scope of the disclosed embodiments being indicated by the following claims and their equivalents.

What is claimed is:

1. A wearable device, comprising:

an HMD (Head Mounted Display)

a PCB (Printed Circuit Board);

a fan element, disposed on the PCB;

a radar module, disposed within 10 mm of the fan element, wherein the radar module detects a rotation state of the fan element, so as to generate a detection signal;

an IMU (Inertial Measurement Unit), disposed on the PCB, wherein the IMU measures a movement state of the PCB, so as to generate a measurement data; and a processor, calibrating the measurement data according to the detection signal, so as to output a calibration measurement result.

2. The wearable device as claimed in claim 1, wherein the fan element comprises a blade portion, and a metal-coated region is formed on the blade portion.

3. The wearable device as claimed in claim 1, wherein the radar module operates at a frequency within an mmWave (Millimeter Wave) frequency band, and the a mmWave (Millimeter Wave) frequency band from 59 GHz to 67 GHz.

4. The wearable device as claimed in claim 1, wherein the radar module selectively operates in a CW (Continuous Wave) mode or an FMCW (Frequency Modulated Continuous Wave) mode.

5. The wearable device as claimed in claim 1, wherein the radar module comprises:

a transmitter, transmitting a radar signal to the fan element;

a receiver, receiving a reflection signal from the fan element; and a controller, generating the detection signal according to the reflection signal.

6. The wearable device as claimed in claim 1, wherein the detection signal comprises a time sequential data, and the time sequential data is related to a rotation speed of the fan element.

7. The wearable device as claimed in claim 6, wherein the processor analyzes the time sequential data so as to generate magnitude information and phase information, and then the processor calibrates the measurement data according to the magnitude information and the phase information.

8. The wearable device as claimed in claim 7, wherein the magnitude information corresponds to a separation distance between the fan element and the radar module, and the phase information corresponds to a rotation angle of the fan element.

9. The wearable device as claimed in claim 1, wherein the IMU is a nine-axis sensor and comprises:

a triaxial accelerometer, measuring an acceleration of the PCB;

a triaxial gyroscope, measuring an angular velocity of the PCB; and a triaxial magnetometer, measuring a magnetic field of the PCB;

wherein the measurement data comprises the acceleration, the angular velocity, and the magnetic field.

10. A control method, comprising the steps of:

providing a PCB, a fan element, a radar module, and an IMU, wherein the fan element and the IMU are disposed on the PCB, and the radar module is within 10 mm of the fan element;

detecting a rotation state of the fan element via the radar module, so as to generate a detection signal;

measuring a movement state of the PCB via the IMU, so as to generate a measurement data; and calibrating the measurement data according to the detection signal, so as to output a calibration measurement result.

11. The control method as claimed in claim 10, further comprising:

forming a metal-coated region on a blade portion of the fan element.

12. The control method as claimed in claim 10, wherein the radar module operates at a frequency within an mmWave (Millimeter Wave) frequency band, and the a mmWave frequency band is from 59 GHz to 67 GHz.

13. The control method as claimed in claim 10, wherein the radar module selectively operates in a CW mode or an FMCW mode.

14. The control method as claimed in claim 10, further comprising:

transmitting a radar signal to the fan element via the radar module;

receiving a reflection signal from the fan element via the radar module; and generating the detection signal according to the reflection signal via the radar module.

15. The control method as claimed in claim 10, wherein the detection signal comprises a time sequential data, and the time sequential data is related to a rotation speed of the fan element.

16. The control method as claimed in claim 15, further comprising:

analyzing the time sequential data, so as to generate magnitude information and phase information.

17. The control method as claimed in claim 16, further comprising:

calibrating the measurement data according to the magnitude information and the phase information.

18. The control method as claimed in claim 16, wherein the magnitude information corresponds to a separation distance between the fan element and the radar module, and the phase information corresponds to a rotation angle of the fan element.

19. The control method as claimed in claim 10, further comprising:

measuring an acceleration of the PCB via the IMU;

measuring an angular velocity of the PCB via the IMU; and measuring a magnetic field of the PCB via the IMU;

wherein the measurement data comprises the acceleration, the angular velocity, and the magnetic field.

* * * * *